(12) United States Patent
Beak et al.

(10) Patent No.: US 11,824,138 B2
(45) Date of Patent: Nov. 21, 2023

(54) DISPLAY DEVICE AND METHOD OF FABRICATING THE SAME

(71) Applicant: LG Display Co., Ltd., Seoul (KR)

(72) Inventors: JungSun Beak, Paju-si (KR); SeongJoo Lee, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 284 days.

(21) Appl. No.: 16/667,247

(22) Filed: Oct. 29, 2019

(65) Prior Publication Data

US 2020/0135971 A1  Apr. 30, 2020

(30) Foreign Application Priority Data

Oct. 31, 2018 (KR) .................... 10-2018-0132614

(51) Int. Cl.
| | | |
|---|---|---|
| *H01L 33/10* | (2010.01) | |
| *H01L 33/60* | (2010.01) | |
| *H01L 33/14* | (2010.01) | |
| *H10K 59/122* | (2023.01) | |
| *H10K 59/173* | (2023.01) | |

(52) U.S. Cl.
CPC ............ *H01L 33/10* (2013.01); *H01L 33/14* (2013.01); *H01L 33/60* (2013.01); *H10K 59/122* (2023.02); *H10K 59/173* (2023.02)

(58) Field of Classification Search
CPC .... G09G 2300/0456–046; H01L 33/10; H01L 33/60; H01L 33/14; H01L 33/46; H01L 33/44; H01L 27/156; H01L 33/58; H10K 59/122; H10K 59/173
See application file for complete search history.

(56) References Cited

U.S. PATENT DOCUMENTS

| | | | |
|---|---|---|---|
| 8,287,159 B2 | 10/2012 | Kato | |
| 8,791,474 B1 | 7/2014 | Bibl et al. | |
| 9,178,123 B2 | 11/2015 | Sakariya et al. | |
| 9,698,204 B2 | 7/2017 | Kamura et al. | |
| 10,090,335 B2 | 10/2018 | Kang et al. | |
| 2014/0027709 A1* | 1/2014 | Higginson | H01L 25/0753 257/13 |
| 2014/0159064 A1* | 6/2014 | Sakariya | H01L 33/60 257/88 |
| 2014/0159067 A1 | 6/2014 | Sakariya et al. | |
| 2015/0349293 A1 | 12/2015 | Park et al. | |
| 2016/0372528 A1* | 12/2016 | Kamura | H01L 27/3211 |
| 2017/0133357 A1* | 5/2017 | Kuo | H01L 25/0753 |
| 2018/0097049 A1 | 4/2018 | Choi et al. | |
| 2018/0122836 A1* | 5/2018 | Kang | H01L 27/124 |
| 2018/0158987 A1* | 6/2018 | Lee | H01L 33/16 |
| 2018/0197844 A1 | 7/2018 | Higginson et al. | |

FOREIGN PATENT DOCUMENTS

| | | |
|---|---|---|
| CN | 101740610 A | 6/2010 |
| CN | 104838508 A | 8/2015 |
| CN | 104871231 A | 8/2015 |

(Continued)

*Primary Examiner* — Shahed Ahmed
*Assistant Examiner* — Sun Mi Kim King
(74) *Attorney, Agent, or Firm* — Seed IP Law Group LLP

(57) ABSTRACT

There is provided a display device. The display device includes an optical structure disposed to increase the amount of light emitted from a light-emitting diode; and a bank coupled with the optical structure.

25 Claims, 9 Drawing Sheets

(56) References Cited

FOREIGN PATENT DOCUMENTS

| | | | |
|---|---|---|---|
| CN | 105794322 A | 7/2016 | |
| CN | 106684108 A | 5/2017 | |
| CN | 108022940 A | 5/2018 | |
| JP | 2010123450 A * | 6/2010 | ............. B82Y 10/00 |
| KR | 10-2016-0010869 A | 1/2016 | |
| KR | 10-2017-0005643 A | 1/2017 | |
| KR | 20180046494 A | 5/2018 | |
| WO | WO 2014093065 A1 | 6/2014 | |
| WO | WO-2014149864 A1 * | 9/2014 | ........... G09G 3/2003 |

\* cited by examiner

DISPLAY DEVICE AND METHOD OF FABRICATING THE SAME

CROSS-REFERENCE TO RELATED APPLICATIONS

This application claims the priority of Korean Patent Application No. 10-2018-0132614 filed on Oct. 31, 2018, in the Korean Intellectual Property Office, the disclosure of which is incorporated herein by reference.

BACKGROUND

Technical Field

The present disclosure relates to a display device and a method of fabricating the same, and more particularly to a display device using light-emitting diodes (LEDs) and a method of fabricating the same.

Description of the Related Art

Liquid-crystal display devices and organic light-emitting display devices are widely employed as the screen of typical electronic devices such as mobile phones and laptop computers and find more and more applications. Such display devices have a limitation in reducing the size of the bezel. For example, a liquid-crystal display device requires a sealant used to seal the liquid-crystal molecules and to attach the upper substrate and the lower substrate together, and thus there is a limitation in decreasing the size of the bezel. In addition, an organic light-emitting display device requires an encapsulation layer to protective organic light-emitting diodes since the organic light-emitting diodes are made of an organic material and thus are very vulnerable to moisture or oxygen. Accordingly, there is a limitation in decreasing the size of the bezel. Accordingly, for a very large screen that is implemented by disposing a plurality of liquid-crystal display panels or organic light-emitting display panels in a tile pattern, bezels between adjacent panels are easily seen by a viewer.

As an alternative to this, a display device using small LEDs as light-emitting elements is being developed. An LED is made of an inorganic material instead of an organic material, and therefore has excellent reliability and a longer lifetime than a liquid-crystal display device or an organic light-emitting display device. In addition, the LEDs can be turned on and off quickly, consume less power, are robust to impact resistance and stable, and can display a high-brightness image. Accordingly, LEDs are advantageous for large screens. Above all, a display device using small LEDs as light-emitting elements can be implemented without a bezel, which is advantageous to be applied to a very large-sized display device fabricated by connecting a plurality of display devices.

BRIEF SUMMARY

In various embodiments, the present disclosure provides a structure for improving the luminous efficiency of a display device.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device includes: at least a light-emitting diode (LED) disposed in each of pixels; a bank configured to prevent light emitted from the light-emitting diode from being transmitted to an adjacent pixel; and an optical structure disposed on a side surface of the bank to improve luminous efficiency.

The optical structure may cover the side surface of the bank to reflect light emitted from the light-emitting diode toward an image display side. The reflectance of the optical layer may be 90% or higher.

The display device may further include: at least one planarization layer surrounding the light-emitting diode, and the bank may be disposed on the planarization layer. The planarization layer may include a first planarization layer on a thin-film transistor and a second planarization layer on the first planarization layer. The thin-film transistor may be connected to the light-emitting diode through a contact hole of the first planarization layer and the second planarization layer.

The bank may include a black material absorb light and the side surface of the bank may be inclined with respect to a horizontal plane by an angle of 80 to 90 degrees.

The display device may further include: a protective layer on the bank, and at least a part of the protective layer may be between the optical structure and the bank. The protective layer may adjust the angle of the side surface of the bank.

According to another aspect of the present disclosure, there is provided a micro LED display device. The micro LED display device may include an optical structure disposed to increase the amount of light emitted from a light-emitting diode; and a bank coupled with the optical structure.

The optical structure may include an optical layer configured to reflect light emitted from the light-emitting element toward the bank; and a protective layer configured to form a shape of a side surface of the bank. The bank may include a material absorbing light.

Other detailed matters of the exemplary embodiments are included in the detailed description and the drawings.

According to exemplary embodiments of the present disclosure, it is possible to further increase the luminance of a display device and to suppress color mixing between pixels. As a result, the visibility of display devices according to exemplary embodiments of the present disclosure can be improved. Moreover, according to exemplary embodiments of the present disclosure, it is possible to elongate the lifetime of a display device.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
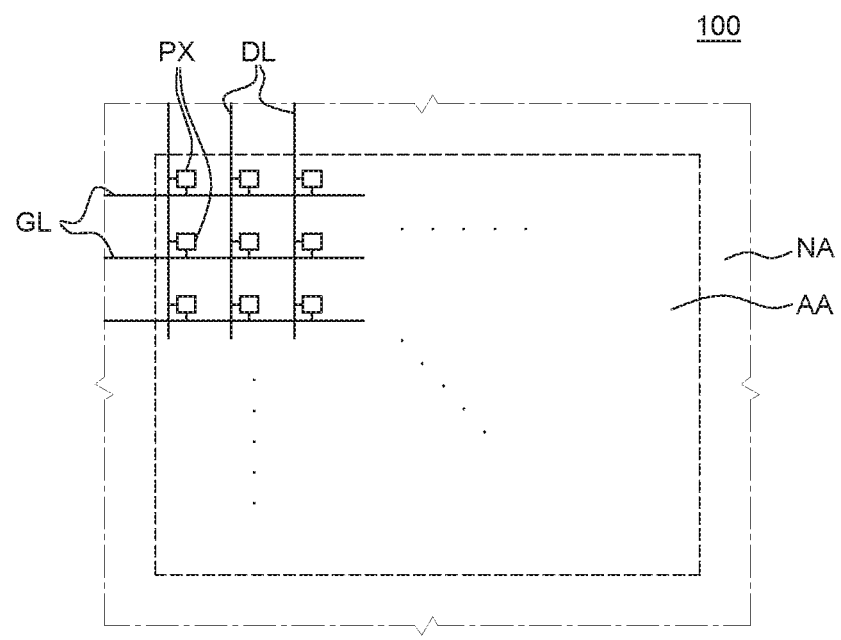
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Figure 2:
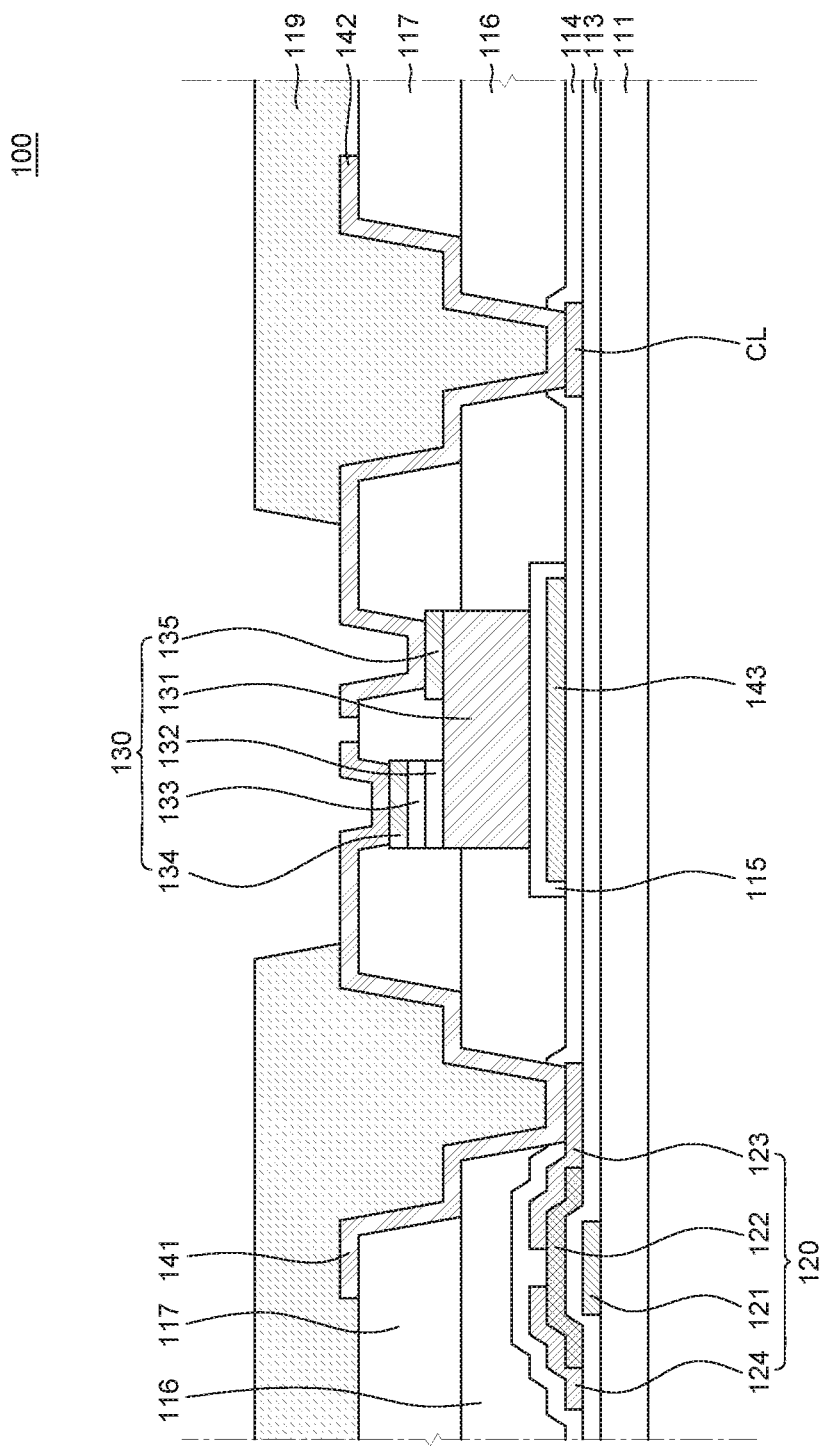
FIG. 2 is a cross-sectional view of a display device according to an exemplary embodiment of the present disclosure.

Hereinafter, a display device according to exemplary embodiments of the present disclosure will be described in detail with reference to accompanying drawings FIGS. 1 and 2 are a plan view and a cross-sectional view of a display device according to an exemplary embodiment of the present disclosure, respectively.

An active area AA where images are displayed and a non-active area NA surrounding the active area AA may be defined on a display device 100. Light-emitting elements, e.g., light-emitting diodes (LEDs) and driving elements for driving the light-emitting elements, e.g., thin-film transistors, may be disposed in the active area AA. The non-active area NA is an area where no image is displayed, and a variety of lines, control circuits and the like connected to the elements disposed in the active area AA may be disposed in the non-active area NA.

Although the display device 100 shown in FIG. 1 has the active area AA and the non-active area NA defined thereon, the present disclosure is not limited thereto. The display device may not include the non-active area NA. That is to say, when a tiling display is implemented by using the display device 100 according to an exemplary embodiment of the present disclosure, the distance between the outermost LED 130 of one panel and the outermost LED of an adjacent panel can be equal to the distance between LEDs in a single panel. Thus, it is possible to implement a zero-bezel where substantially no bezel is formed. Therefore, the display device 100 according to the exemplary embodiment of the present disclosure may include the active area AA only and no non-active area NA may be defined on the substrate 111.

A plurality of pixels PX is disposed in the active area AA. Each of the pixels PX is a unit for emitting light. The plurality of pixels PX may include, but is not limited to, a red sub-pixel PX, a green sub-pixel PX, and a blue sub-pixel PX. Each of the plurality of pixels PX may include a thin-film transistor 120 as a driving element and an LED 130 as a light-emitting element. The LED 130 and the thin-film transistor 120 may be connected to drivers such as a gate control circuit and a data control circuit through lines such as a gate line GL for a data line DL. If the chip size of the LED 130 is less than 100 micrometers (µm), it may be referred to as a micro LED display device. If the chip size of the LED 130 is several hundreds of micrometers, it may be referred to as a mini LED display device.

It can be seen from FIG. 2 that the display device according to the exemplary embodiment of the present disclosure is implemented by stacking a variety of functional elements on a substrate 111. The substrate 111 supports the elements thereon and may be made of an insulating material. For example, the substrate 111 may be made of glass, a resin or the like. In addition, the substrate 111 may include a polymer or a plastic. In some exemplary embodiments, the substrate 111 may be made of a plastic material having flexibility.

The thin-film transistor 120 is formed on the substrate 111. For example, a gate electrode 121 is disposed on the substrate 111, and an active layer 122 is disposed on the gate electrode 121. A gate insulating layer 113 for insulating the active layer 122 from the gate electrode 121 is disposed between the gate electrode 121 and the active layer 122. A source electrode 123 and a drain-electrode 124 are disposed on the active layer 122, and an interlayer dielectric layer 114 is disposed on the source electrode 123 and the drain-electrode 124 for protecting the thin-film transistor 120. A hole may be formed in the interlayer dielectric layer 114 to expose a part of the source electrode 123 of the thin-film transistor 120. In some implementations, the interlayer dielectric layer 114 may be eliminated.

A gate line GL may be formed on the same layer as the gate electrode 121. The gate line GL may be made of the same material as the gate electrode 121. The data line DL may also be formed in a similar manner as the gate line GL.

A common line CL is disposed on the gate insulating layer 113. The common line CL is for applying a common voltage to the LED 130 and may be disposed apart from the gate line GL or the data line DL. In addition, the common line CL may be extended in the same direction as the gate line GL or the data line DL. The common line CL may be made of the same material as the source electrode 123 and the drain-electrode 124. It is, however, to be understood that the common line CL may be made of the same material as the gate electrode 121 as well. The interlayer dielectric layer 114 is formed on the common line CL, with a hole formed therein, via which a part of the common line CL is exposed.

A reflective layer 143 is disposed on the interlayer dielectric layer 114. The reflective layer 143 is for reflecting a part of the light emitted from the LED 130 toward the substrate 111 back to the above of the display device 100 so that the light exits. The reflective layer 143 may be made of a metal material having a high reflectance.

An adhesive layer 115 is disposed on the reflective layer 143. The adhesive layer 115 is a layer for attaching the LED 130 on the reflective layer 143 and may insulate the reflective layer 143 made of a metal material from the LED 130. The adhesive layer 115 may be made of, but is not limited to, a thermosetting material or a photocurable material.

The LED 130 is disposed on the adhesive layer 115 so that it overlaps with the reflective layer 143. The LED 130 includes an n-type layer 131, an active layer 132, a p-type layer 133, an n-electrode 135 and a p-electrode 134. In the following description, an LED having a lateral structure is employed as the LED 130. It is, however, to be understood that the present disclosure is not limited thereto. An LED having a vertical structure or a flip chip LED may also be employed as the LED 130. The LED 130 may be in micro size (chip size less than 100 microns) or mini size (chip size of hundreds of microns).

An example stack structure of the LED 130 is as follows: The n-type layer 131 may be formed by implanting n-type impurities into gallium nitride (GaN). The active layer 132 is disposed on the n-type layer 131. The active layer 132 is an emissive layer of the LED 130 that emits light and may be formed of a nitride semiconductor, for example, indium gallium nitride (InGaN). The p-type layer 133 is disposed on the active layer 132. The p-type layer 133 may be formed by implanting p-type impurity into gallium nitride. It is, however, to be understood that the constituent materials of the n-type layer 131, the active layer 132 and the p-type layer 133 are not limited thereto.

As described above, after the n-type layer 131, the active layer 132 and the p-type layer 133 are sequentially stacked, a predetermined portion may be etched out, and then the n-electrode 135 and the p-electrode 134 may be formed, such that the LED 130 may be implemented. The predetermined portion is a space for separating the n-electrode 135 from the p-electrode 134. The predetermined portion may be etched out so that a part of the n-type layer 131 is exposed. In other words, the surface of the LED 130 on which the n-electrode 135 and the p-electrode 134 are disposed is not flat, and the n-electrode 135 and the p-electrode 134 may have different levels.

As such, the n-electrode 135 may be disposed on the exposed n-type layer 131. The n-electrode 135 may be made of a conductive material, for example, a transparent conductive oxide. On the other hand, the p-electrode 134 may be disposed on the non-etched region, that is, on the p-type layer 133. The p-electrode 134 may be made of a conductive material, for example, a transparent conductive oxide. In addition, the p-electrode 134 may be made of the same material as the n-electrode 135.

As described above, the LED 130 may be disposed such that the n-type layer 131 is closer to the reflective layer 143 than the n-electrode 135 and the p-electrode 134 are.

A first planarization layer 116 and a second planarization layer 117 are disposed on the upper surface of the substrate 111. The first planarization layer 116 provides a flat surface over the thin-film transistor 120. The first planarization layer 116 may provide a flat surface over the thin-film transistor 120 except the region where the LED 130 is disposed and contact holes. The second planarization layer 117 may be disposed on the first planarization layer 116. The second planarization layer 117 may be disposed over the thin-film transistor 120 and the LED 130 except the contact holes. The second planarization layer 117 may be formed such that a part of the p-electrode 134 and a part of the n-electrode 135 of the LED 130 are opened. Although the two planarization layers are disposed in fabricating the display device 100 in the example shown in FIG. 2E, the present disclosure is not limited thereto. The display device 100 may include a single planarization layer. In addition, the planarization layers may be made up of three or more layers.

The first planarization layer 116 and the second planarization layer 117 may serve to fix the location of the LED 130. Specifically, the first planarization layer 116 and the second planarization layer 117 may be formed after the LED 130 is disposed and may be in tight contact with the LED 130. Previously, a space for accommodating an LED such as a cup or a hole is formed in the planarization layer, and then an LED is transferred to the space. In contrast, according to the exemplary embodiment of the present disclosure, the LED is mounted and then the planarization layer is disposed, so that the LED can be more stably fixed.

In addition, the first planarization layer 116 and the second planarization layer 117 can allow the source electrode 123 to be smoothly connected to the p-electrode 134. As shown in FIG. 2, the first connection electrode 141 can be extended with a gentle slope along the planarization layers 116 and 117 between the source electrode 123 and the p-electrode 134. If there is no planarization layer, the first connection electrode 141 is extended with a sharp slope along the sidewall of the LED between the source electrode 123 and the p-electrode 134 and thus it is more likely that the first connection electrode 141 is broken. Therefore, the source electrode 123 can be more stably connected to the p-electrode 134 by virtue of the planarization layers 116 and 117. Likewise, the planarization layers also allow the common line CL to be stably connected to the n-electrode 135.

The first planarization layer 116 and the second planarization layer 117 may be formed via a single process or two different processes. The planarization layers may be formed via two different processes when it takes too long to form a single planarization layer. When the first planarization layer 116 and the second planarization layer 117 are formed via two different processes, contact holes in the layers may also be formed at different time points.

The first connection electrode 141 connects the thin-film transistor 120 with the p-electrode 134 of the LED 130. The first connection electrode 141 may be in contact with the source electrode 123 of the thin-film transistor 120 through a contact hole formed through first planarization layer 116, the second planarization layer 117, the interlayer dielectric layer 114 and the adhesive layer 115, and may be in contact with the p-electrode 134 of the LED 130 through a contact hole formed through the second planarization layer 117. It is, however, to be understood that the present disclosure is not limited thereto. The first connection electrode 141 may be in contact with the drain-electrode 124 of the thin-film transistor 120 depending on the type of the thin-film transistor 120. The first connection electrode 141 may be defined as an anode electrode.

The second connection electrode 142 connects the common line CL with the n-electrode 135 of the LED 130. The second connection electrode 142 is in contact with the common line CL through a contact hole formed through first planarization layer 116, the second planarization layer 117, the interlayer dielectric layer 114 and the adhesive layer 115, and is in contact with the n-electrode 135 of the LED 130 through a contact hole formed through the second planarization layer 117. The second connection electrode 142 may be defined as a cathode electrode.

Accordingly, when the display device 100 is turned on, different voltage levels applied to the source electrode 123 of the thin-film transistor 120 and the common line CL are applied to the p-electrode 134 and the n-electrode 135 through the first electrode 141 and the second connection electrode 142, respectively, such that the LED 130 can emit light. Although the thin-film transistor 120 is electrically connected to the p-electrode 134 and the common line CL is electrically connected to the n-electrode 135 in the example shown in FIG. 2, this is merely illustrative. The thin-film transistor 120 may be electrically connected to the n-electrode 135 and the common line CL may be electrically connected to the p-electrode 134.

A bank 119 is formed on the second planarization layer 117 as an insulating layer defining an emission zone. The bank 119 may be formed of an organic insulating material and may be formed of the same material as the first planarization layer 116 and/or the second planarization layer 117. Alternatively, the bank 119 may include a black material to absorb light in order to prevent light emitted from the LED 130 from being transmitted to an adjacent sub-pixel PX such that the light is mixed.

However, the inventors have recognized that there is an adverse effect of the bank containing the black material. The adverse effect refers to that the black bank also absorbs light that is supposed to exit to the distance side (upper side of FIG. 2) as well as suppressing color mixing between adjacent pixels and reducing reflected light by a metal thereunder (e.g., TFT), such that the amount of emitted light and/or luminous efficiency are also decreases. In view of the above, the inventors of the present disclosure have devised a structure for overcome the adverse effect.

Figure 3:
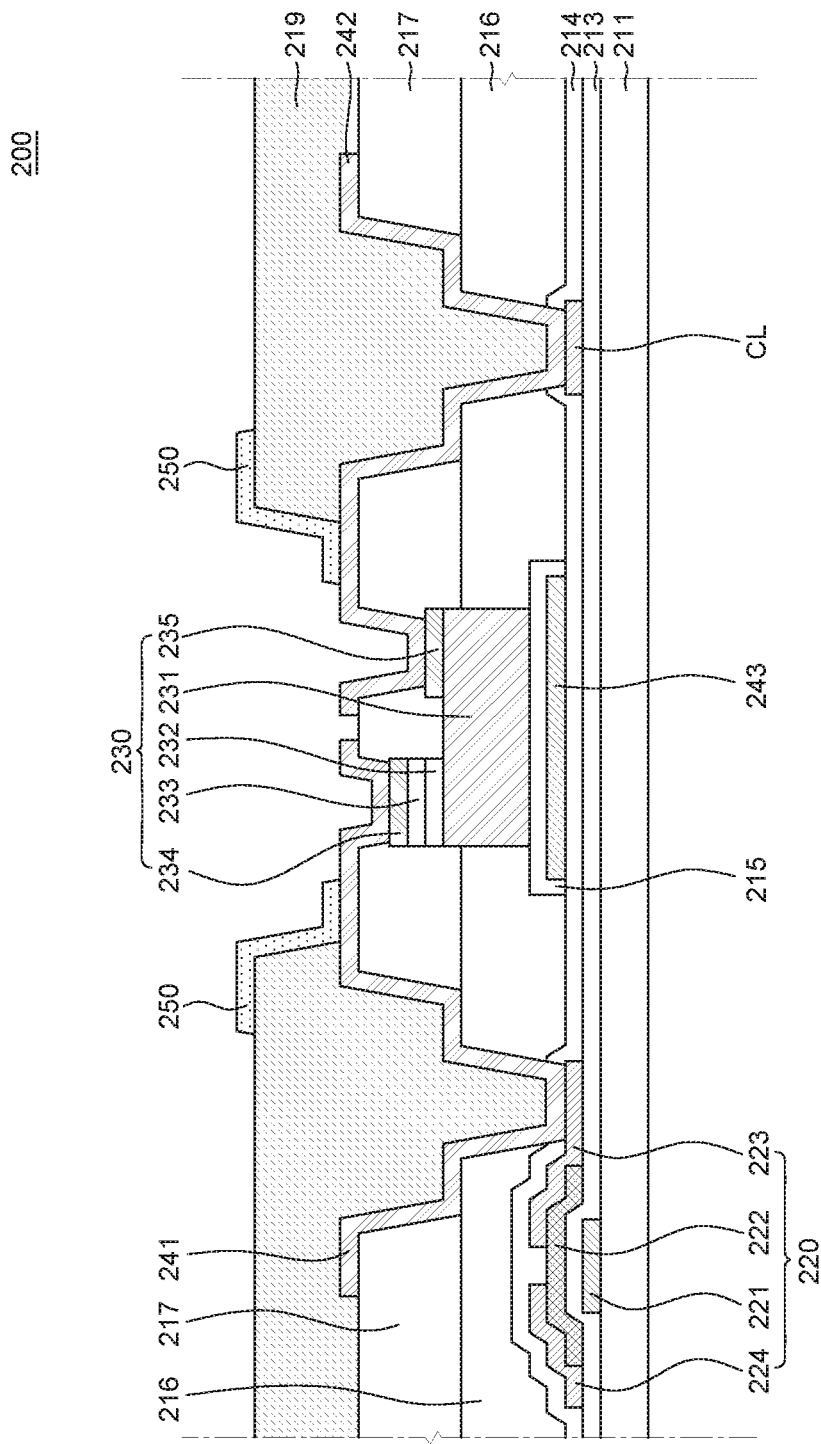
FIG. 3 is a cross-sectional view of a part of a display device according to another exemplary embodiment of the present disclosure.

FIG. 3 is a cross-sectional view of a part of a display device according to another exemplary embodiment of the present disclosure.

The display device 200 shown in FIG. 3 employs a structure for overcoming the adverse effect caused by a black bank to improve the luminous efficiency. The structure for improving the luminous efficiency includes an optical structure that reflects light toward a bank so that the light travels to the outside of the display device (in the emission direction). An example of the optical structure is an optical layer 250 shown in FIG. 3. The display device 200 shown in FIG. 3 is substantially identical to the display device shown in FIGS. 1 and 2 except the optical layer 250 disposed on the side surface of the bank; and, therefore, the redundant descriptions (that is, descriptions of a substrate 211, a gate electrode 221, a gate insulating layer 213, and interlayer dielectric 214, an adhesive layer 215, an active layer 222, and transistor 220 having a source electrode 223 and a drain-electrode 224, an n-type layer 231, an active layer 232, a p-type layer 233, an n-electrode 235 and a p-electrode 234, first connection electrode 241, second connection electrode 242, etc.) will be omitted. In various embodiments, the optical structure may be referred to as an optical layer, such as the optical layer 250, and the optical layer may be or include a layer of one or more materials which improves or increases luminous efficiency or luminous efficacy (e.g., a ratio of luminous flux to power) of the display device 200. For example, the optical structure may be or include an optical layer that is reflective, so that at least a portion of light that is incident on the optical structure may be reflected by the optical structure, thereby improving or increasing luminous efficiency of the display device 200 in comparison with a display device that does not include such an optical structure.

The display device 200 may include light-emitting diodes 230, at least one of which is disposed in each pixel, a bank 219 for preventing light emitted from each of the light-emitting diodes 230 from being transmitted to an adjacent pixel; and an optical structure disposed on a side surface of the bank 219 to improve luminous efficiency.

As mentioned above, the black bank disposed to prevent color mixing between neighboring (sub) pixels has the adverse effect of absorbing light that is supposed to exit to the outside of the display device (image display side). To overcome such adverse effect, the inventors of the present disclosure have devised the optical structure for improving the luminous efficiency. An example of the optical structure is the optical layer 250 on the side surface of the bank 219. The optical layer 250 covers the side surface of the bank 219 to prevent the light emitted from the light-emitting diode 230 from being absorbed by the bank 219 and reflects the light traveling toward the side surface of the bank so that the light travels to the image display side (the upper side of FIG. 3).

The optical layer 250 is made of a material that reflects light. For example, the optical layer 250 may be made of silver (Ag), aluminum (AL), or the like, which has excellent reflection efficiency. The optical layer 250 may have a reflectance of 90% or higher. Since the optical layer 250 improves the outcoupling efficiency, it is advantageous for fabricating a high-luminance and high-definition display device. In addition, it is possible to prevent color mixture between adjacent pixels more efficiently by virtue of the optical layer 250.

The optical layer 250 may also be disposed on the upper surface of the bank 219 as well as on the side surface of the bank 219, as shown in FIG. 3. The optical layer 250 may also be first on the upper surface of the bank 219 by depositing or applying a material for the optical layer 250 on the entire upper surface of the bank and then patterning it, leaving the desired part.

The bank 219 may include a light-absorbing material (e.g., a black material) that absorbs light. The light-absorbing material may be carbon, black ink or the like.

The bank 219 is disposed over the planarization layers. The planarization layers surround the light-emitting diode 230 and serve to put the light-emitting diode 230 in place. In the exemplary embodiment of FIG. 3, the planarization layer includes a first planarization layer 216 over the thin-film transistor 220 and a second planarization layer 217 on the first planarization layer. The thin-film transistor 220 is connected to the light-emitting diode 230 through a contact hole of the first planarization layer 216 and the second planarization layer 217.

The light-emitting diode 230 may have a diameter of 100 micrometers or less. A reflective layer 243 may be disposed under the light-emitting diode 230 to reflect the light emitted from the light-emitting diode 230 toward the image display side.

Figure 4:
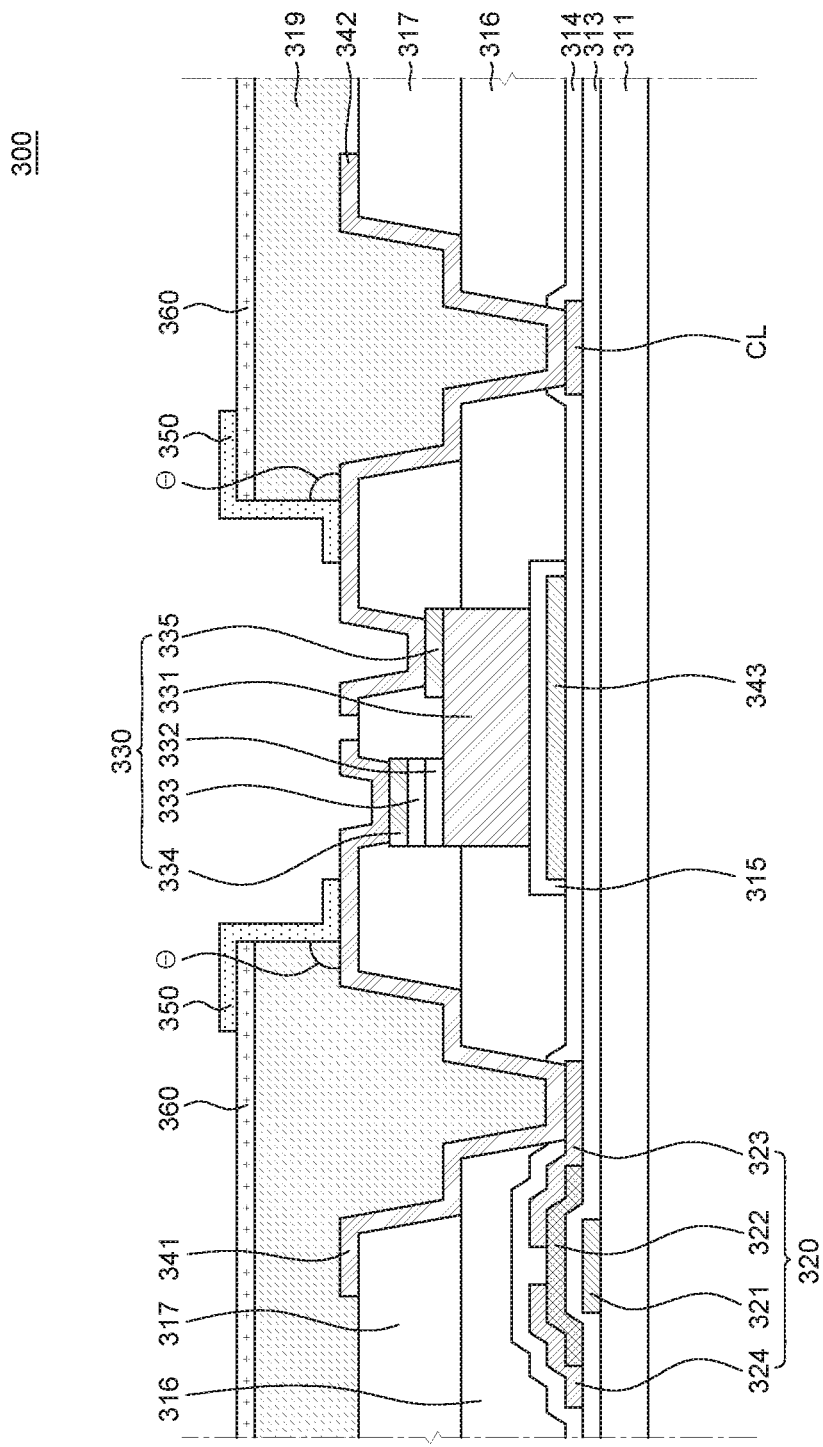
FIG. 4 is a cross-sectional view of a part of a display device according to yet another exemplary embodiment of the present disclosure.

FIG. 4 is a cross-sectional view of a part of a display device according to yet another exemplary embodiment of the present disclosure.

The display device 300 may be a micro LED display device and may include an optical structure disposed to increase the amount of light emitted from a light-emitting diode; and a bank coupled with the optical structure.

The display device 300 of FIG. 4 includes an optical structure having a higher performance than the optical structure of FIG. 3. The display device 300 shown in FIG. 4 is substantially identical to the display device 200 shown in FIG. 3 except the shapes of an optical layer 350, a protective layer 360 and a bank 319; and, therefore, the redundant descriptions (that is, descriptions of a substrate 311, a gate electrode 321, a gate insulating layer 313, and interlayer dielectric 314, an adhesive layer 315, a first planarization layer 316, a second planarization layer 317, an active layer 322, reflective layer 343, transistor 320 having a source electrode 323 and a drain-electrode 324, an n-type layer 331, an active layer 332, a p-type layer 333, an n-electrode 335 and a p-electrode 334, etc.) will be omitted. The optical layer 350 is disposed to reflect the light emitted from the light-emitting diode 330 toward the bank 319. The protective layer 360 forms the side surface of the bank 319 in a particular shape. In the exemplary embodiment shown in FIG. 4, the bank 319 is formed so that its side surface is substantially perpendicular to the horizontal plane (image display plane of the display device). In other words, the taper angle θ of the bank 319 is approximately 90°. The inventors have found from experiments that it is possible to reflect more amount of light to the outside (the upper side in the drawings) by disposing the optical layer 350 closer to the vertical direction (with respect to the image display plane). Accordingly, the side surface of the bank 319 is formed to be inclined by an angle of approximately 80 to 90 degrees with respect to the horizontal plane. In some embodiments, the side surface of the bank 319 is formed to be inclined by an angle of approximately 80 to 90 degrees with respect to a surface of the substrate 311 (e.g., the upper surface of the substrate 311, which may be parallel to the horizontal plane or to the image display plane). In some embodiments, a first portion of the optical layer 350 is disposed over the bank 319 (e.g., on or over an upper surface of the bank 319), a second portion of the optical layer 350 is disposed on the side surface of the bank 319, and a third portion of the optical layer 350 is disposed adjacent to the side surface of the bank 319, such as on a surface of one of the connection electrodes 341, 342.

The protective layer 360 is disposed to adjust the angle of the side surface of the bank 319. That is to say, the protective layer 360 serves to form the taper angle of the side surface of the bank 319 close to the right angle. The optical layer 350 disposed on the vertical side surface of the bank 319 formed by using the protective layer 360 improves the outcoupling efficiency and thus is very advantageous for a high-luminance high-definition display device. In addition, it is possible to further suppress color mixture between adjacent pixels by virtue of the optical layer 350. Hereinafter, a process of forming the side surface of the bank 319 will be described.

FIGS. 5A to 5E are cross-sectional views showing a part of a process of fabricating the display device according to the exemplary embodiment of FIG. 4. The bank 319 and the optical structure may be formed via the illustrated process. It is to be understood that the illustrated fabricating process is merely illustrative, and the present disclosure is not limited thereto.

Figure 5A:
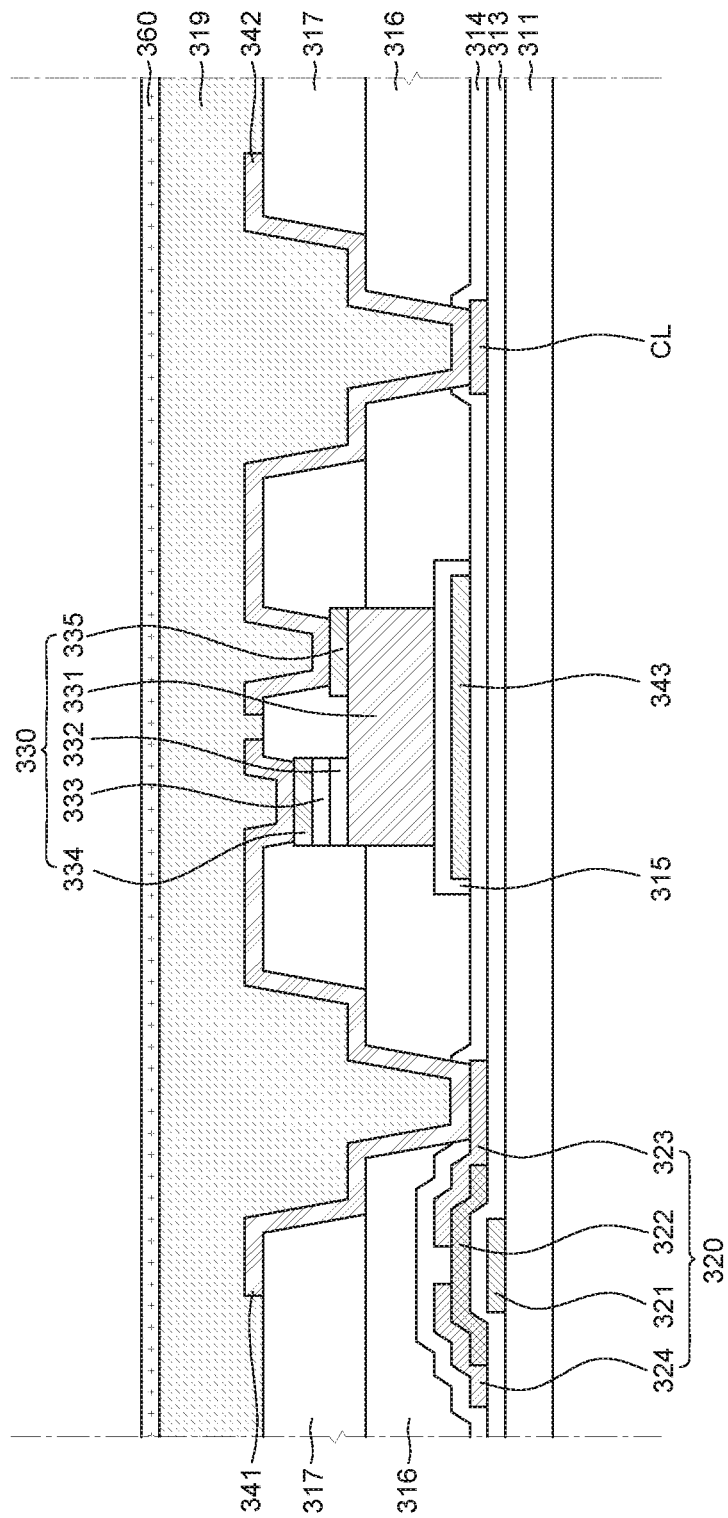
FIGS. 5A to 5E are cross-sectional views showing a part of a process of fabricating the display device according to the exemplary embodiment of FIG. 4.

Referring to FIG. 5A, a TFT 320, a light-emitting diode 330, planarization layers 316 and 317, connection electrodes 341 and 342, etc., are formed, and then a bank material 319 covers them entirely. Then, a protective layer material 360 covers the bank material 319 entirely. The bank material 319 may include a light-absorbing material. Materials such as metal (ITO, IZO, etc.) or silicon oxide, silicon nitride, amorphous silicon and the like may be used for the protection layer material 360, so that it later may serve as an etch stopper. Besides, a material having a different etch selectivity from organic materials may be used as the protective layer material.

Figure 5B:
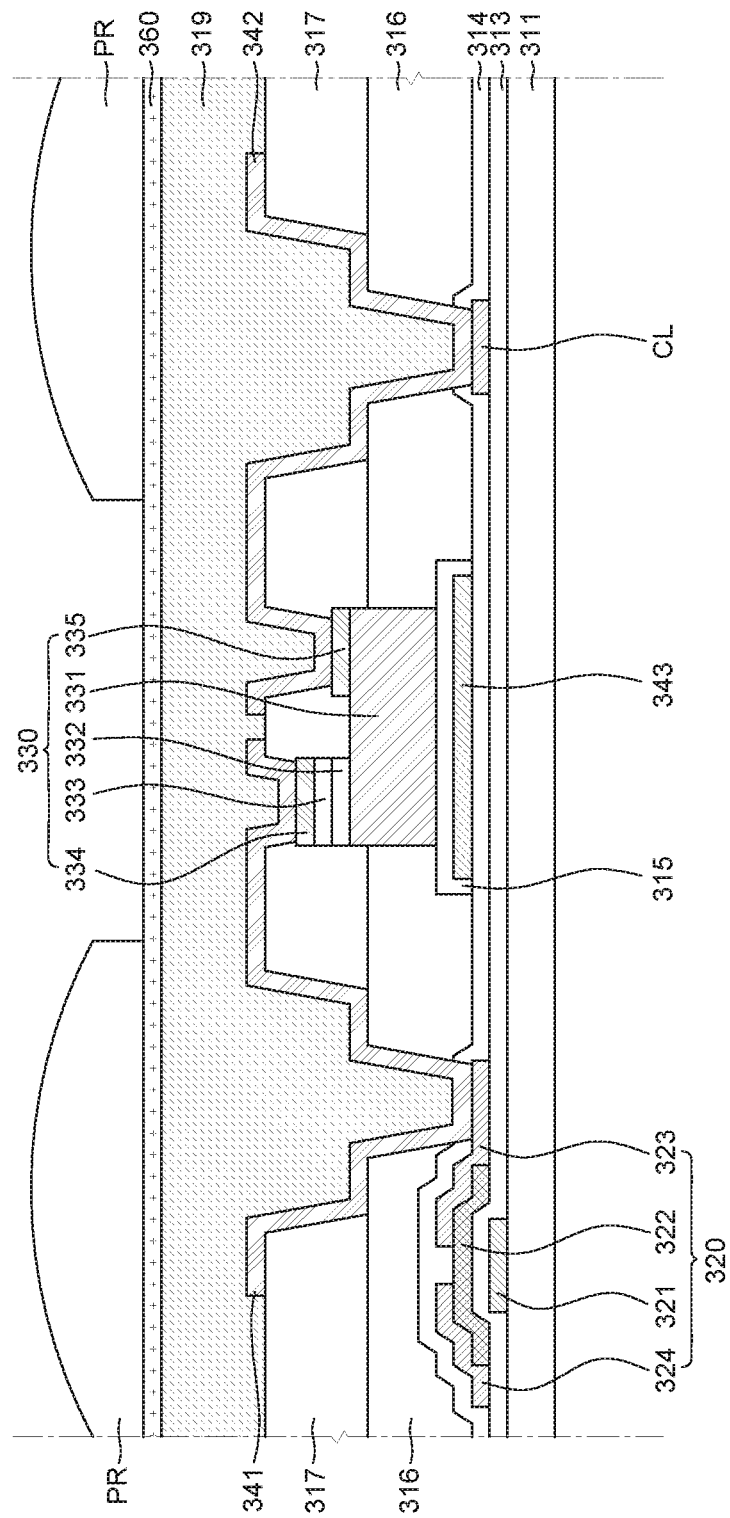
Figure 5C:
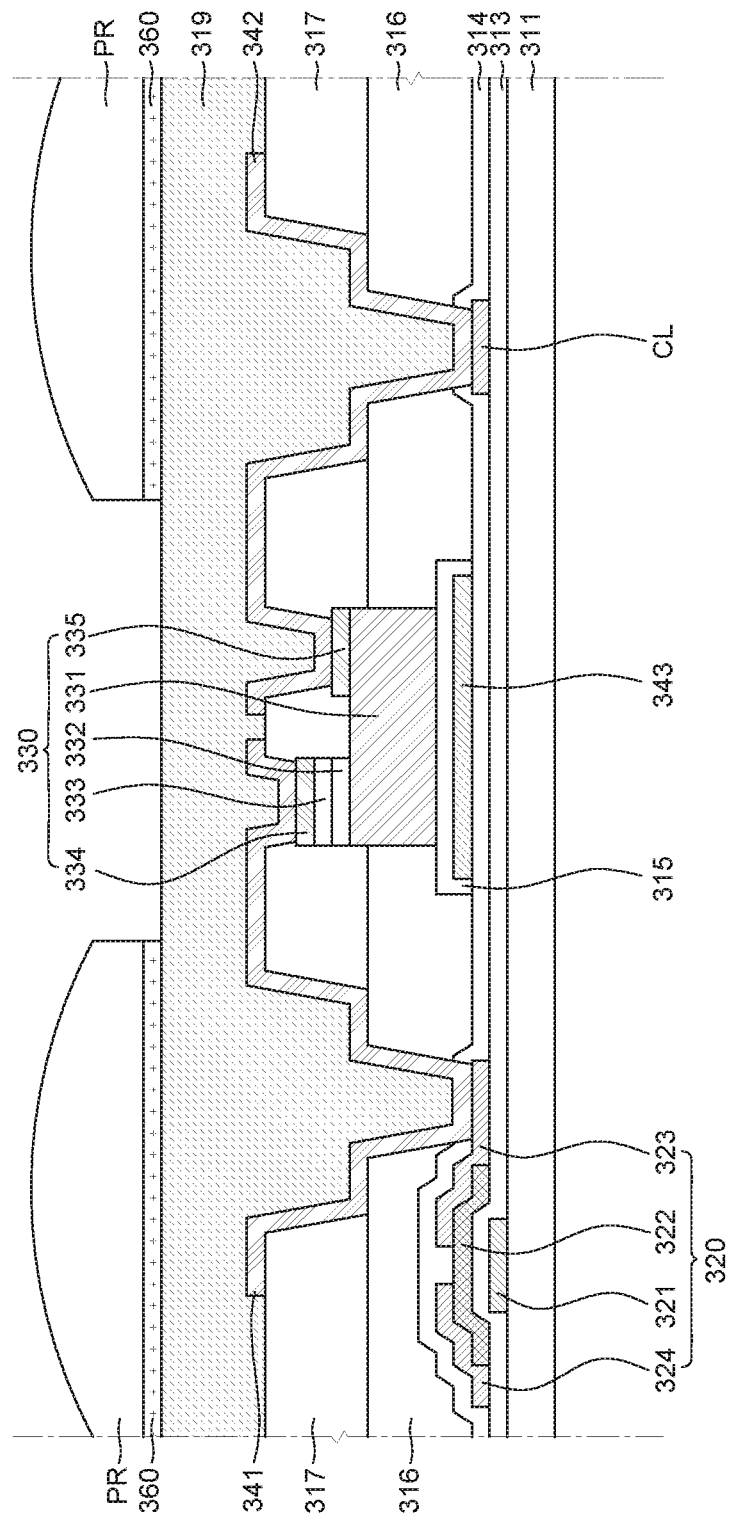

Subsequently, as shown in FIG. 5B, a photoresist PR is disposed to cover a part of the protective material to be left. Subsequently, as shown in FIG. 5C, the part of the protective material not covered with the photoresist PR is etched. An opening is to be formed at the etched part of the protective material.

Figure 5D:
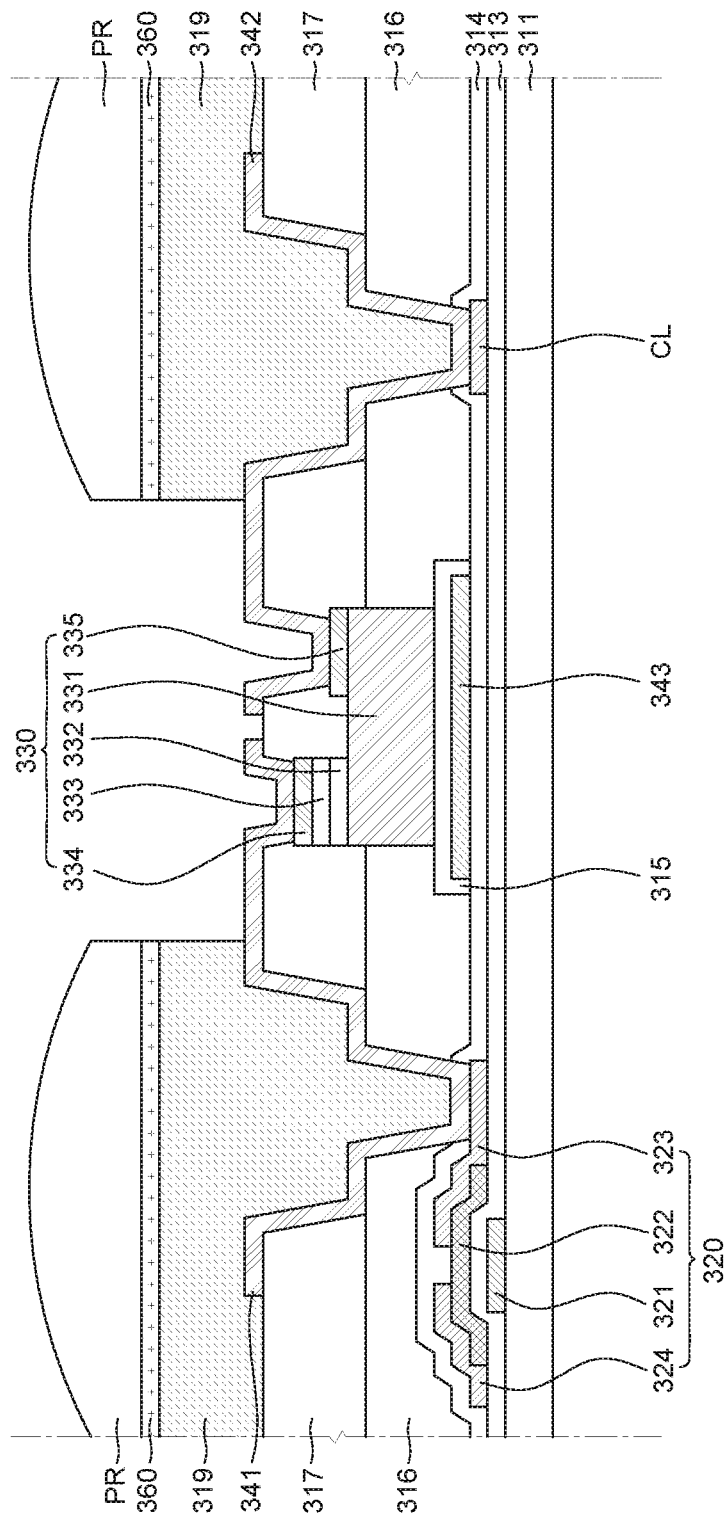

Subsequently, as shown in FIG. 5D, a part of the bank material not covered with the photoresist PR and the remaining the protective layer 360 is etched. In doing so, the part of the bank material may be removed by dry etching. If there is no protective layer, the side surface of the bank 319 conforms to the taper angle of the side surface of the photoresist PR, so that the side surface of the bank 319 has a small angle of inclination. In contrast, if there is the protective layer 360, the side surface of the bank 319 can have a substantially vertical inclination.

Figure 5E:
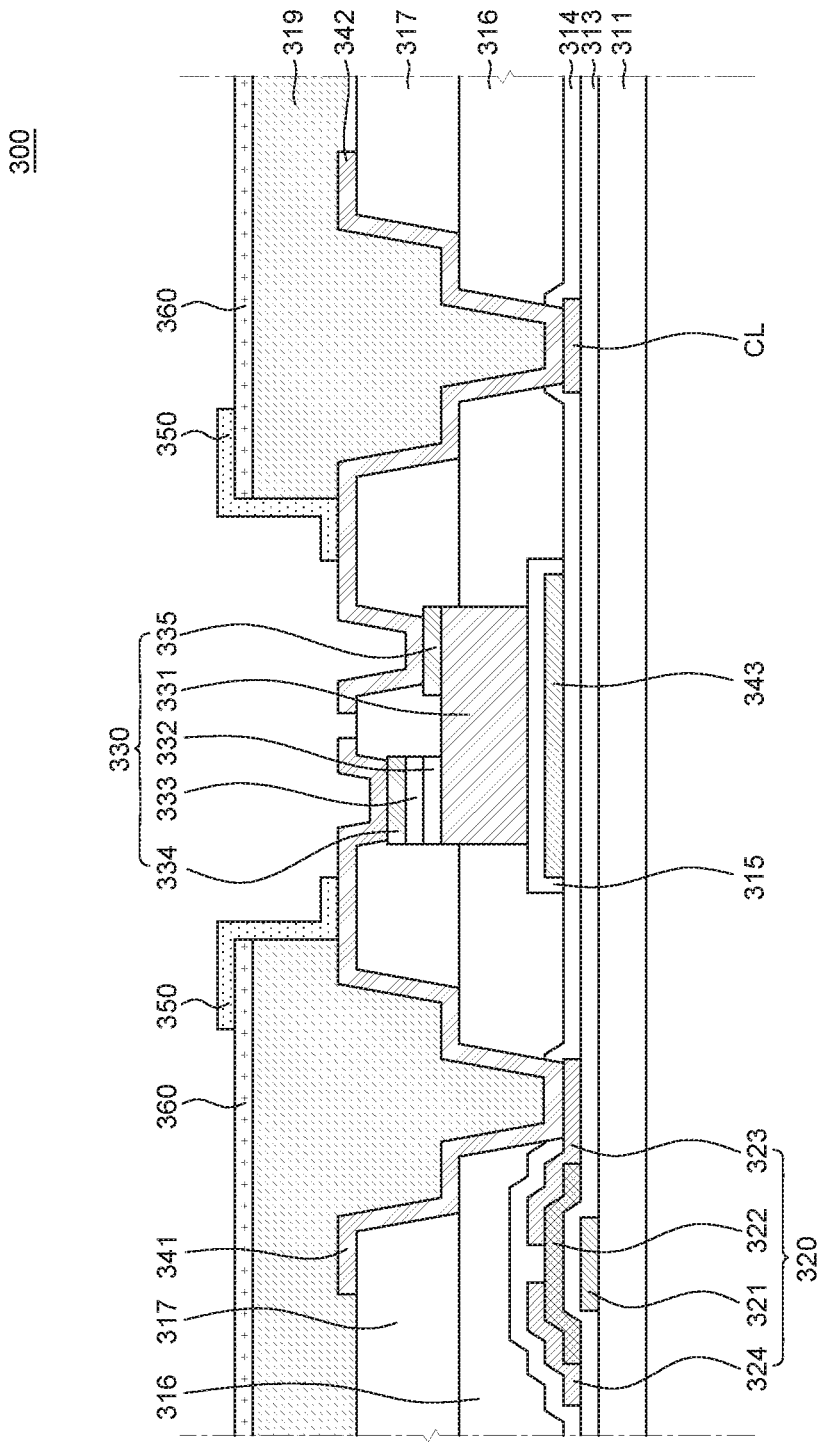

Lastly, as shown in FIG. 5E, an optical layer 350 covers the side surface of the bank 319. In doing so, the optical layer 350 may cover a part of the protective layer 360, so that at least a part of the protective layer 360 is between the optical layer 350 and the bank 319.

The inventors of the present disclosure have also found out that as the height of the bank 319 increases, the amount of reflected light increases. Accordingly, the bank 319 may have a height of 1.5 to 5 micrometers (μm).

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A display device, comprising:
a light-emitting diode (LED) disposed in each of a plurality of pixels;
a bank configured to prevent light emitted from the light-emitting diode from being transmitted to adjacent pixels of the plurality of pixels;
a reflective optical structure disposed on a side surface of the bank; and
a protective layer on an upper surface of the bank, the protective layer having a side surface aligned with the side surface of the bank along a direction perpendicular to the upper surface of the bank,
wherein the optical structure directly contacts and covers the side surface of the bank and at least a part of an upper surface of the protective layer.
2. The display device of claim 1, wherein the optical structure is an optical layer that covers the side surface of the bank to reflect light emitted from the light-emitting diode toward an image display side of the display device.
3. The display device of claim 2, wherein the optical layer has a reflectance of 90% or higher.
4. The display device of claim 1, further comprising:
a planarization layer surrounding the light-emitting diode, wherein the bank is disposed on the planarization layer.
5. The display device of claim 4, wherein the planarization layer comprises a first planarization layer on a thin-film transistor and a second planarization layer on the first planarization layer.
6. The display device of claim 5, wherein the thin-film transistor is connected to the light-emitting diode through a contact hole of the first planarization layer and the second planarization layer.
7. The display device of claim 1, wherein the bank comprises a black material that absorbs light.
8. The display device of claim 1, wherein the side surface of the bank is inclined with respect to a horizontal plane by an angle of 80 to 90 degrees.
9. The display device of claim 8,
wherein at least a part of the protective layer is between the optical structure and the bank.
10. The display device of claim 1, wherein the protective layer includes at least one of a metal, silicon oxide, silicon nitride, amorphous silicon or a material having a different etch selectivity from a material of the bank.
11. The display device of claim 1, wherein the light-emitting diode has a diameter of 100 micrometers or less.
12. The display device of claim 1, further comprising: a reflective layer disposed under the light-emitting diode and configured to reflect light emitted from the light-emitting diode toward an image display side of the display device.
13. The display device of claim 1, further comprising:
a connection electrode electrically connected to the LED, wherein at least a portion of the bank is disposed on the connection electrode, and the optical structure includes a first portion on an upper surface of the bank, a second portion on the side surface of the bank, and a third portion on the connection electrode.
14. A micro LED display device, comprising:
a reflective optical structure configured to increase an amount of light emitted from a light-emitting element;
a bank coupled with the optical structure; and
a protective layer configured to form a shape of a side surface of the bank and being on the bank, the protective layer having a side surface aligned with the side surface of the bank along a direction perpendicular to an image display plane of the micro LED display device,
wherein the optical structure directly contacts and covers the side surface of the bank and at least a part of an upper surface of the protective layer.
15. The micro LED display device of claim 14, wherein the optical structure comprises an optical layer configured to reflect light emitted from the light-emitting element toward the bank.
16. The micro LED display device of claim 14, wherein the bank comprises a material that absorbs light.
17. The micro LED display device of claim 14, wherein the optical structure comprises an optical layer having a reflectance of 90% or higher.
18. The display device of claim 1, further comprising at least one connection electrode connected to the light-emitting diode,
wherein the optical structure is disposed on a surface of the at least one connection electrode.
19. A display device, comprising:
a light-emitting diode (LED) disposed in each of a plurality of pixels, each of the pixels including an anode, a cathode and at least one light emitting layer;
a bank configured to prevent light emitted from the light-emitting diode from being transmitted to adjacent pixels of the plurality of pixels;
a reflective optical structure that is a different structure from each of the anode and cathode of the LED, the reflective optical structure having a first portion disposed on a side surface of the bank, a second portion on a top surface of the bank and a third portion on surface adjacent to the bank, extending in a direction away from the bank; and
a protective layer on the bank,
wherein the reflective optical structure is a single, integral structure having the second and third portions extending from respective opposite ends of the first portion; and
wherein the majority of the reflective optical structure is above each of the anode, cathode and light emitting layer of each respective pixel.
20. The display device of claim 19 wherein the first portion and the third portion of the of reflective optical structure extend perpendicular to each other.
21. The display device of claim 19 wherein the second portion and the third portion of the reflective optical structure extend parallel to each other.
22. The display device of claim 19 wherein the side surface of the bank is parallel to a side surface of the protective layer.
23. A display device comprising:
a light-emitting diode disposed in each of a plurality of pixels;
a bank configured to prevent light emitted from the light-emitting diode from being transmitted to adjacent pixels of the plurality of pixels;
a reflective optical structure having a first portion disposed on a side surface of the bank, a second portion on a top surface of the bank and a third portion on surface adjacent to the bank, extending in a direction away from the bank; and
a protective layer on the bank,
wherein the reflective optical structure is a single, integral structure having the second and third portions extending from respective opposite ends of the first portion, wherein a side surface of the bank is parallel to a side surface of the protective layer, and wherein the second portion of the reflective optical structure extends over a portion of the protective layer along a direction perpendicular to an image.

24. The display device of claim 19 wherein the third portion of the reflective optical structure extends over a second electrode and is above a light emitting layer of the LED.

25. The display device of claim 19 wherein all portions of the reflective optical structure are above each of the anode, cathode and light emitting layer of each respective pixel.

* * * * *

UNITED STATES PATENT AND TRADEMARK OFFICE
CERTIFICATE OF CORRECTION

| | |
|---|---|
| PATENT NO. | : 11,824,138 B2 |
| APPLICATION NO. | : 16/667247 |
| DATED | : November 21, 2023 |
| INVENTOR(S) | : JungSun Beak et al. |

It is certified that error appears in the above-identified patent and that said Letters Patent is hereby corrected as shown below:

In the Claims

Column 12, Claim 20, Line 45:
"third portion of the of reflective optical"
Should read:
--third portion of the reflective optical"--.

Signed and Sealed this
Thirtieth Day of April, 2024

Katherine Kelly Vidal
*Director of the United States Patent and Trademark Office*